(12) United States Patent
Sutardja et al.

(10) Patent No.: US 7,185,225 B2
(45) Date of Patent: Feb. 27, 2007

(54) SELF-REPARABLE SEMICONDUCTOR AND METHOD THEREOF

(75) Inventors: Sehat Sutardja, Los Altos Hills, CA (US); Pantas Sutardja, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 707 days.

(21) Appl. No.: 10/358,709

(22) Filed: Feb. 5, 2003

(65) Prior Publication Data

US 2004/0153752 A1 Aug. 5, 2004

Related U.S. Application Data

(60) Provisional application No. 60/430,199, filed on Dec. 2, 2002.

(51) Int. Cl.
*G06F 11/00* (2006.01)
(52) U.S. Cl. .......................... 714/11; 712/13
(58) Field of Classification Search ............. 712/13, 712/20
See application file for complete search history.

(56) References Cited

U.S. PATENT DOCUMENTS

| | | | | |
|---|---|---|---|---|
| 4,566,102 A | * | 1/1986 | Hefner | 714/7 |
| 4,933,895 A | * | 6/1990 | Grinberg et al. | 708/509 |
| 5,204,836 A | | 4/1993 | Reed | |
| 5,423,024 A | | 6/1995 | Cheung | |
| 5,634,067 A | * | 5/1997 | Nagazumi | 712/19 |
| 5,655,069 A | * | 8/1997 | Ogawara et al. | 714/10 |
| 5,737,766 A | * | 4/1998 | Tan | 711/170 |
| 5,748,872 A | * | 5/1998 | Norman | 714/11 |
| 6,145,072 A | * | 11/2000 | Shams et al. | 712/22 |
| 6,256,758 B1 | | 7/2001 | Abramovici et al. | |

(Continued)

FOREIGN PATENT DOCUMENTS

| | | |
|---|---|---|
| EP | 0 361 404 | 4/1990 |
| EP | 0 398 552 | 11/1990 |
| EP | 1 170 666 A2 | 1/2002 |
| EP | 1 170 666 A3 | 6/2002 |
| WO | WO 99/32975 | 7/1999 |
| WO | WO 01/39163 | 5/2001 |

OTHER PUBLICATIONS

Wang, Minghsien; Cutler, Michal; Su, Stephen Y.H.; Reconfiguration of VLSI/WSI Mesh Array Processors with Two-Level Redundancy, 1989, IEEE, pp. 547-550.*

(Continued)

*Primary Examiner*—Scott Baderman
*Assistant Examiner*—Paul Contino

(57) ABSTRACT

A self-reparable semiconductor includes multiple functional units that perform the same function and that include sub-functional units. The semiconductor includes one or more full or partial spare functional units that are integrated into the semiconductor. If a defect in a sub-functional unit is detected, then that sub-functional unit is switched out and replaced with a sub-functional unit in the full or partial spare functional unit. The reconfiguration is realized with switching devices that are associated with the sub-functional units. Defective functional or sub-functional units can be detected after assembly, during power up, periodically during operation, and/or manually.

48 Claims, 12 Drawing Sheets

U.S. PATENT DOCUMENTS

| | | | |
|---|---|---|---|
| 6,337,817 B1 | 1/2002 | Horiguchi et al. | |
| 6,363,021 B2 | 3/2002 | Noh | |
| 6,526,461 B1 * | 2/2003 | Cliff | 710/100 |
| 6,697,979 B1 * | 2/2004 | Vorbach et al. | 714/724 |
| 6,775,529 B1 | 8/2004 | Roo | |
| 6,816,143 B1 * | 11/2004 | Lambert | 345/93 |
| 2002/0133690 A1 * | 9/2002 | Yano et al. | 712/34 |

OTHER PUBLICATIONS

IBM Technical Disclosure Bulletin, Yield and Reliability Enhancement Via Redundancy for VLSI Chips and Wafers, Jun. 1, 1985, pp. 1 and 2.*

Communication dated Jun. 6, 2005 from the European Patent Office for European Patent Application No. 03026882.5-2211.

Notification of First Office Action dated Nov. 25, 2005 for Chineses Patent Application No. 03134804.1; 7 pages.

* cited by examiner

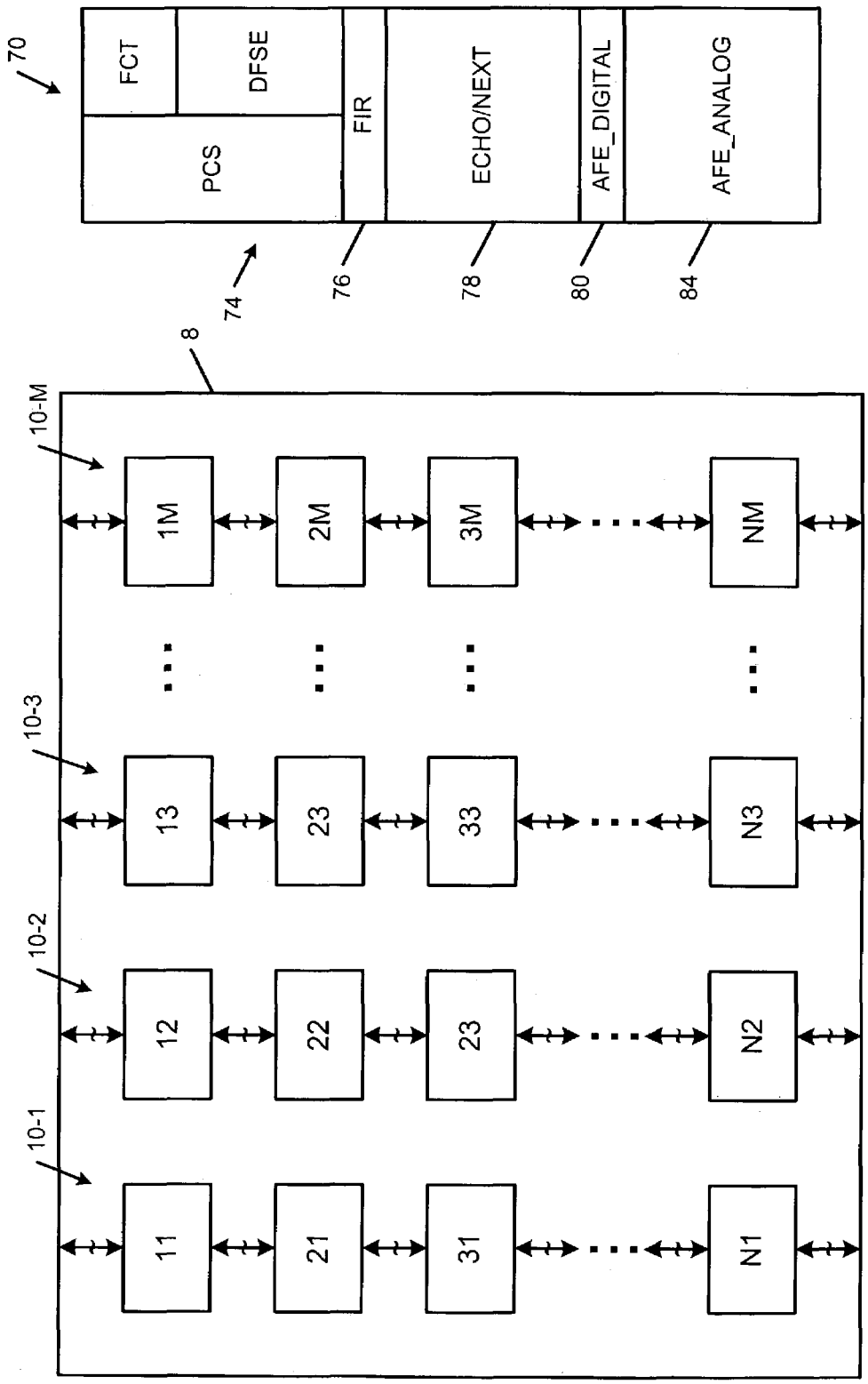

SELF-REPARABLE SEMICONDUCTOR AND METHOD THEREOF

FIELD OF THE INVENTION

The present invention relates to semiconductors, and more particularly to a self-reparable semiconductor with multiple functional units that perform the same function.

BACKGROUND OF THE INVENTION

An increasing trend in the semiconductor industry is to highly integrate an integrated circuit multiple times. For example, the semiconductor may include multiple generally independent functional units that perform the same function. Each functional unit has the same sub-functional units.

Referring now to FIG. 1, a semiconductor 8 includes M generally independent functional units 10-1, 10-2, ..., and 10-M (collectively referred to as functional units 10) that perform the same high level function. Each functional unit 10 includes the same N sub-functional units. For example, the functional unit 10-1 includes sub-functional units 11, 21, 31, ..., and N1. The functional unit 10-2 includes sub-functional units 12, 22, 32, ..., and N2. The functional unit 10-M includes sub-functional units 1M, 2M, 3M, ..., and NM. The sub-functional units in a row perform the same low level function. Typically, there are no connections between the functional units other than ground and power. There are, however, connections between the sub-functional units in a functional unit. The connections may be one-way or two-way and may include one or more connecting wires.

Referring now to FIG. 2, an exemplary functional unit may be a Gigabit physical layer device 70. For example, four or eight Gigabit physical layer devices may be fabricated on the semiconductor. The physical layer device 70 includes a first sub-functional unit 74 that performs physical coding sub-layer (PCS), Flow Control Token (FCT), and Decision Feedback Sequence Estimation (DFSE) functions. A second sub-functional unit 76 implements a finite impulse response (FIR) filter function. A third sub-functional unit 78 performs echo and near end crosstalk (NEXT) functions. Fourth and fifth sub-functional units 80 and 84 implement digital and analog front end (AFE) functions, respectively.

If the yield for each individual functional unit is 90%, then the yield for the semiconductor with x identical functional units is $(0.9)^x$. For example, if a semiconductor includes eight functional units each having a yield of 90%, the yield of the semiconductor is 43%, which is not an acceptable yield.

SUMMARY OF THE INVENTION

A self-reparable semiconductor according to the invention includes a first functional unit with first and second sub-functional units that cooperate to perform a first function. A second functional unit includes first and second sub-functional units that also cooperate to perform the first function. A first spare functional unit includes first and second sub-functional units. The first sub-functional units of the first, second and first spare functional units are functionally interchangeable. The second sub-functional units of the first, second and first spare functional units are functionally interchangeable. Switching devices communicate with the first and second sub-functional units of the first, second and first spare functional units and replace at least one of the first and second sub-functional units of at least one of the first and second functional units with at least one of the first and second sub-functional units of the first spare functional unit when the at least one of the first and second sub-functional units is non-operable.

In other features, a controller identifies non-operable sub-functional units and operates the switching devices to replace the non-operable sub-functional units.

In still other features, the first and second functional units are laid out in one of columns and rows and the first and second sub-functional units of the first and second functional units are laid out in the other of columns and rows.

In other features, the spare functional unit is located one of between the first and second functional units and next to one of the first and the second functional units.

In yet other features, a second spare functional unit includes first and second sub-functional units. The first sub-functional units of the first, second, first spare and second spare functional units are functionally interchangeable. The second sub-functional units of the first, second, first spare and second spare functional units are functionally interchangeable.

In still other features, the first, second, first spare and second spare functional units are laid out in one of columns and rows and the first and second sub-functional units of the first, second, first spare and second spare functional units are laid out in the other of columns and rows. The first and second sub-functional units of the first and second spare functional units and the switching devices are capable of replacing two non-operable sub-functional units that perform the same function and that are located in one of the same row and the same column.

In yet other features, at least one of the switching devices includes a multiplexer that receives p inputs and outputs q outputs where q is less than p. A demultiplexer receives q inputs and outputs p outputs. A switch selectively connects the q outputs of the multiplexer to the p inputs of the demultiplexer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 is a functional block diagram of a semiconductor including multiple functional units each with sub-functional units according to the prior art;

FIG. 2 is a functional block diagram of an exemplary functional unit for a Gigabit physical layer device according to the prior art;

DETAILED DESCRIPTION OF THE PREFERRED EMBODIMENTS

Figure 3B:
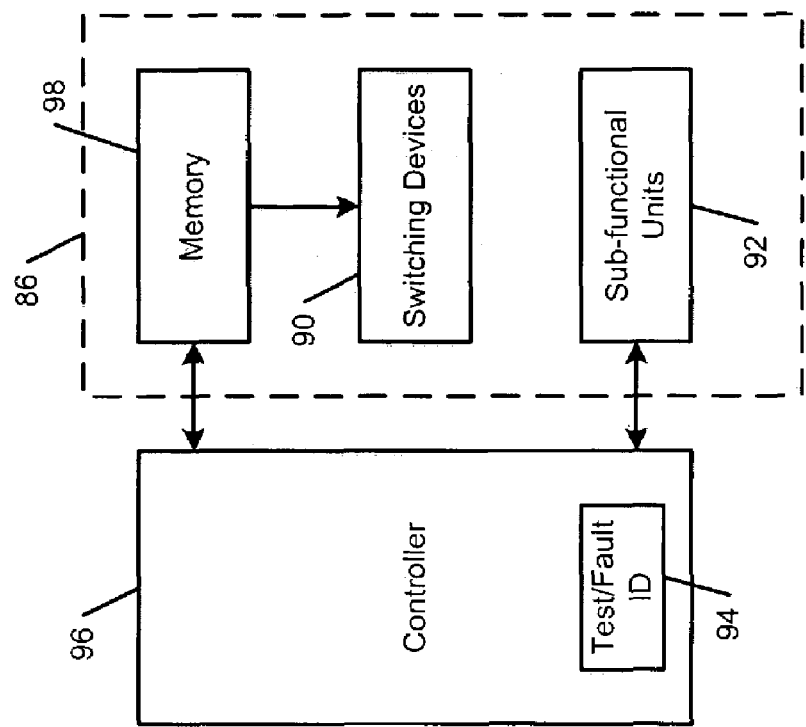
FIG. 3B is a functional block diagram of an off-chip controller that commands the switching devices and optionally includes a test/fault detection circuit.

The following description of the preferred embodiment(s) is merely exemplary in nature and is in no way intended to limit the invention, its application, or uses. For purposes of clarity, the same reference numbers will be used in the drawings to identify similar elements.

A self-reparable semiconductor according to the present invention includes one or more full or partial spare functional units. If a defect in a functional unit or a sub-functional unit is detected, then that functional unit or sub-functional unit is switched out and replaced with a functional unit or sub-functional unit in the full or partial spare functional unit. The reconfiguration is realized with switching devices that may be integrated with or separate from the functional or sub-functional units.

Defective functional or sub-functional units can be detected after assembly, during power up, periodically during operation, and/or manually. While the present invention will be described in conjunction with specific examples, skilled artisans will appreciate that each semiconductor may include any number of functional units that perform the same high-level function. The functional units may include any number of common sub-functional units.

Figure 13:
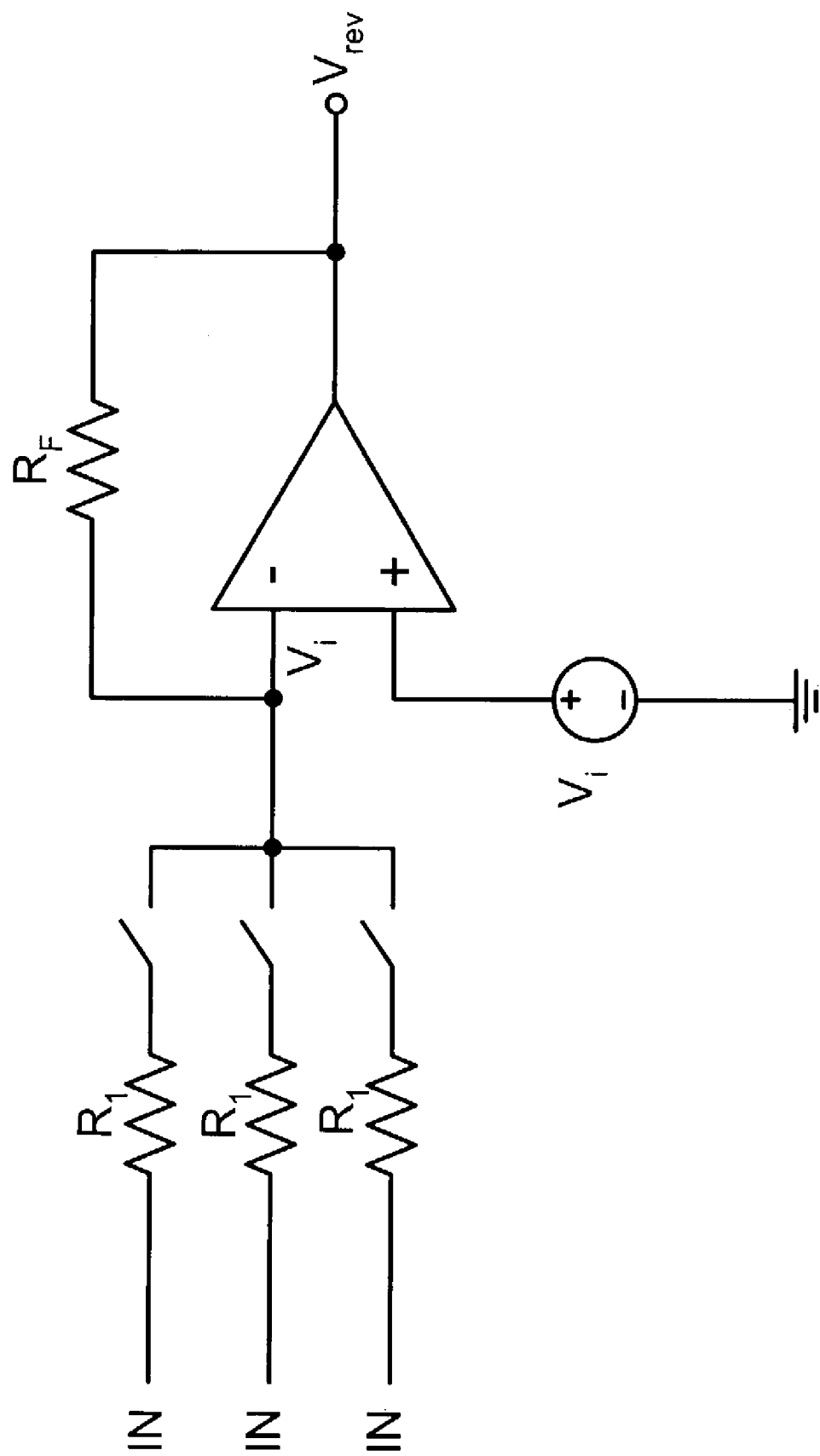
FIG. 13 is an example of a summing node switch.

In addition, while specific switching devices and arrangements are shown, the specific switching devices and arrangements that will be used will depend upon the particular implementation, details of the particular functional and/or sub-functional units and other normal design criteria. Similar or different types of switching devices may be used on the same semiconductor to replace the non-operable functional and/or sub-functional units. When the connecting wires between subfunctional units carry analog signals, analog switching is performed which preferably employs current-switching devices, generally for analog output signals and summing node switching for analog input signals. Such switching devices have several advantages over voltage-based switching devices such as reduced attenuation, lower impedance and lower distortion. FIG. 13 shows an example of summing node switching. Summing node switching provides for input analog signals, which may be greater than Vdd or negative. In contrast to voltage mode switching, voltage signals greater than Vdd or negative may cause the switching transistor to become forward biased. A further explanation of active summing devices may be found in commonly assigned application Ser. No. 09/629,092, filed Jul. 31, 2000 and entitled "Active Resistance Summer For A Transformer Hybrid", the contents of which are incorporated herein by reference.

Digital switching devices may be employed for connecting wires carrying digital signals. These type of switches include for example, standard logic devices, gates, muxes, transistors and the like.

Figure 3A:
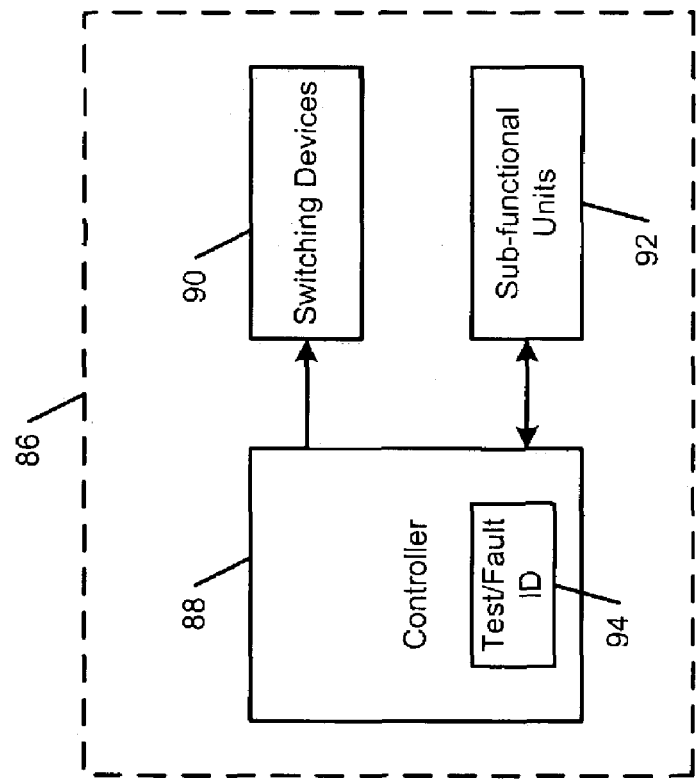
FIG. 3A is a functional block diagram of an on-chip controller that commands the switching devices and optionally includes a test/fault detection circuit.

Referring now to FIG. 3A, a semiconductor 86 of each of the embodiments can include a controller 88 that is located on-chip and that communicates with the switching devices 90 and the sub-functional units 92. A test or fault identification circuit 94 identifies non-operable sub-functional units 92 and generates configuration data. The controller 88 commands the switching devices 90 to replace the non-operable sub-functional units 92 as previously described. The controller 88 may execute a built-in self test mode after assembly, during power up, periodically during operation, and/or manually.

Referring now to FIG. 3B, a semiconductor 86 of each of the embodiments can include a controller 96 that is located off-chip and that is removably connected to on-chip memory 98, such as non-volatile memory. The memory 98 stores configuration data defining switch positions for the switching devices 90. The controller 96 is connected to the sub-functional units 92 and detects and/or tests for failures. The controller 96 uses the test results to define the configuration data that is then stored in the memory 98. When powered on, the configuration data is used to configure the sub-functional units 92. As can be appreciated, there are a variety of other ways to implement the switching devices. For example, fuses, such as laser fuses or anti-fuses, can be used to make and/or break connections to replace functional units and/or sub-functional units. External pins or dip switches can also be used.

Figure 4:
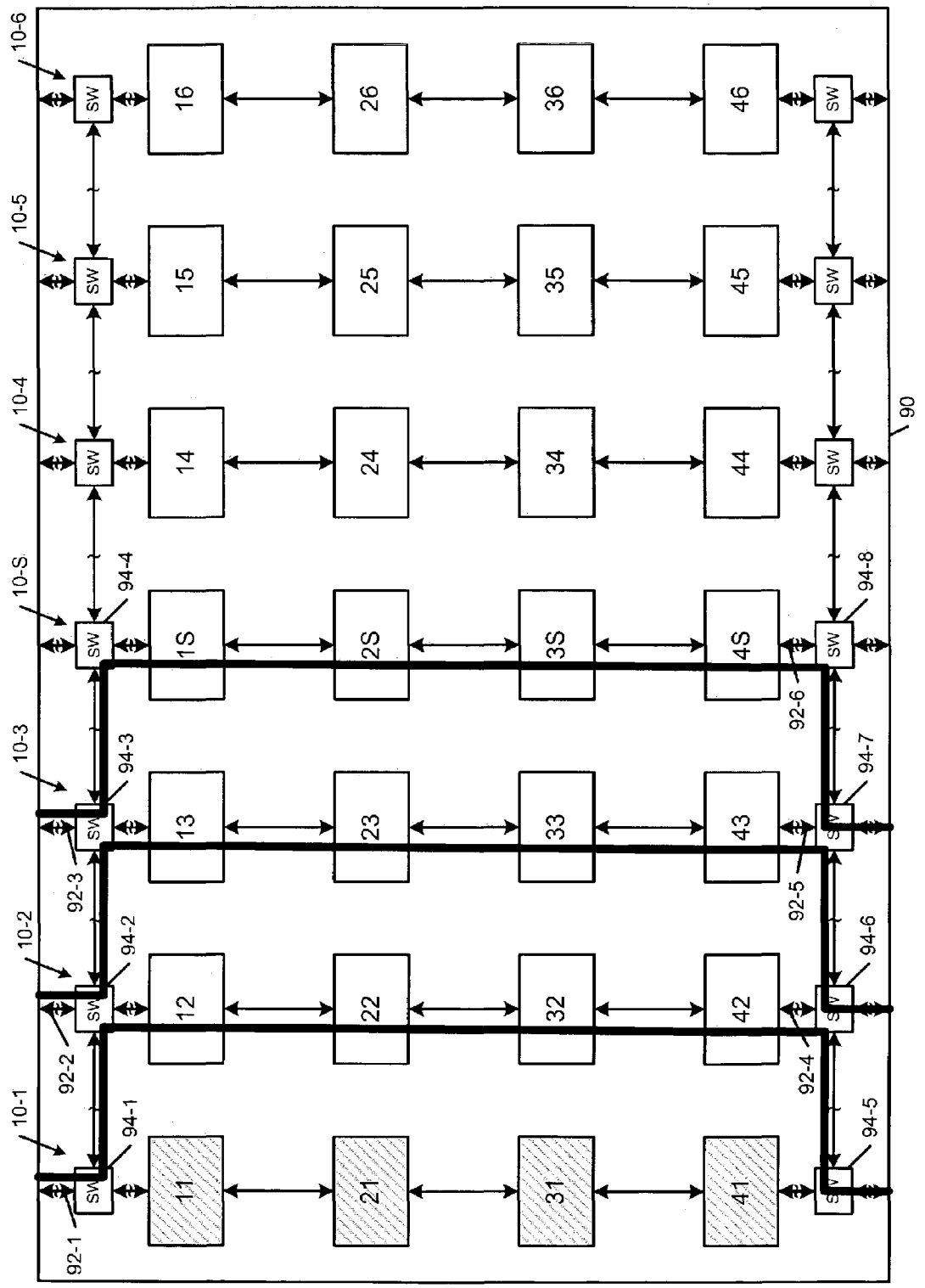
FIG. 4 is a functional block diagram of a first exemplary self-reparable semiconductor including a spare functional unit that replaces a non-operable functional unit according to the present invention.

Referring now to FIG. 4, a spare functional unit 10-S is fabricated on a semiconductor 90 in addition to the functional units 10-1, 10-2, ..., and 10-6. In addition, switching devices 94 are located at inputs and outputs of some or all of the sub-functional units. In the exemplary embodiment illustrated in FIG. 3, the spare functional unit 10-S is located between the functional units 10. As can be appreciated, however, the spare functional unit 10-S can be located in any position on the semiconductor 100. For example, the spare functional unit 10-S can be located to the left or right of any of the functional units 10.

The switching devices 94 and the spare functional unit 10-S allow the semiconductor 90 to replace non-operable functional units 10-1, 10-2, 10-3, 10-4, 10-5 and/or 10-6. In the example in FIG. 4, the spare functional unit 10-S allows any number of sub-functional units in one functional unit to fail. By allowing the replacement of non-operable functional units, the yield of the semiconductor 90 is significantly improved. If one or any combination of the sub-functional units 11, 21, 31, and/or 41 in the functional unit 10-1 fail (as shown by cross-hatched shading), the switches 94 are reconfigured to replace the non-operable sub-functional units 11, 21, 31, and 41 with the sub-functional units in the spare functional unit 10-S.

For example, if the sub-functional unit 11 is non-operable, the inputs 92-1, 92-2, and 92-3 to the sub-functional units 11, 12, and 13 are shifted one functional unit to the right by switches 94-1, 94-2, 94-3, and 94-4. The outputs 92-4, 92-5, and 92-6 of the sub-functional units 42, 43, and 4S are shifted one functional unit to the left by switches 94-5, 94-6, 94-7, and 94-8.

After reconfiguration, the first functional unit 10-1 includes sub-functional units 12, 22, 32, and 42. The second functional unit 10-2 includes sub-functional units 13, 23, 33, and 43. The third functional unit 10-3 includes sub-functional units 1S, 2S, 3S, and 4S. The fourth functional unit 10-4 includes sub-functional units 14, 24, 34, and 44. The fifth functional unit 10-5 includes sub-functional units 15, 25, 35, and 45. The sixth functional unit 10-6 includes sub-functional units 16, 26, 36, and 46. This exemplary embodiment allows replacement on a functional unit basis only.

Figure 5:
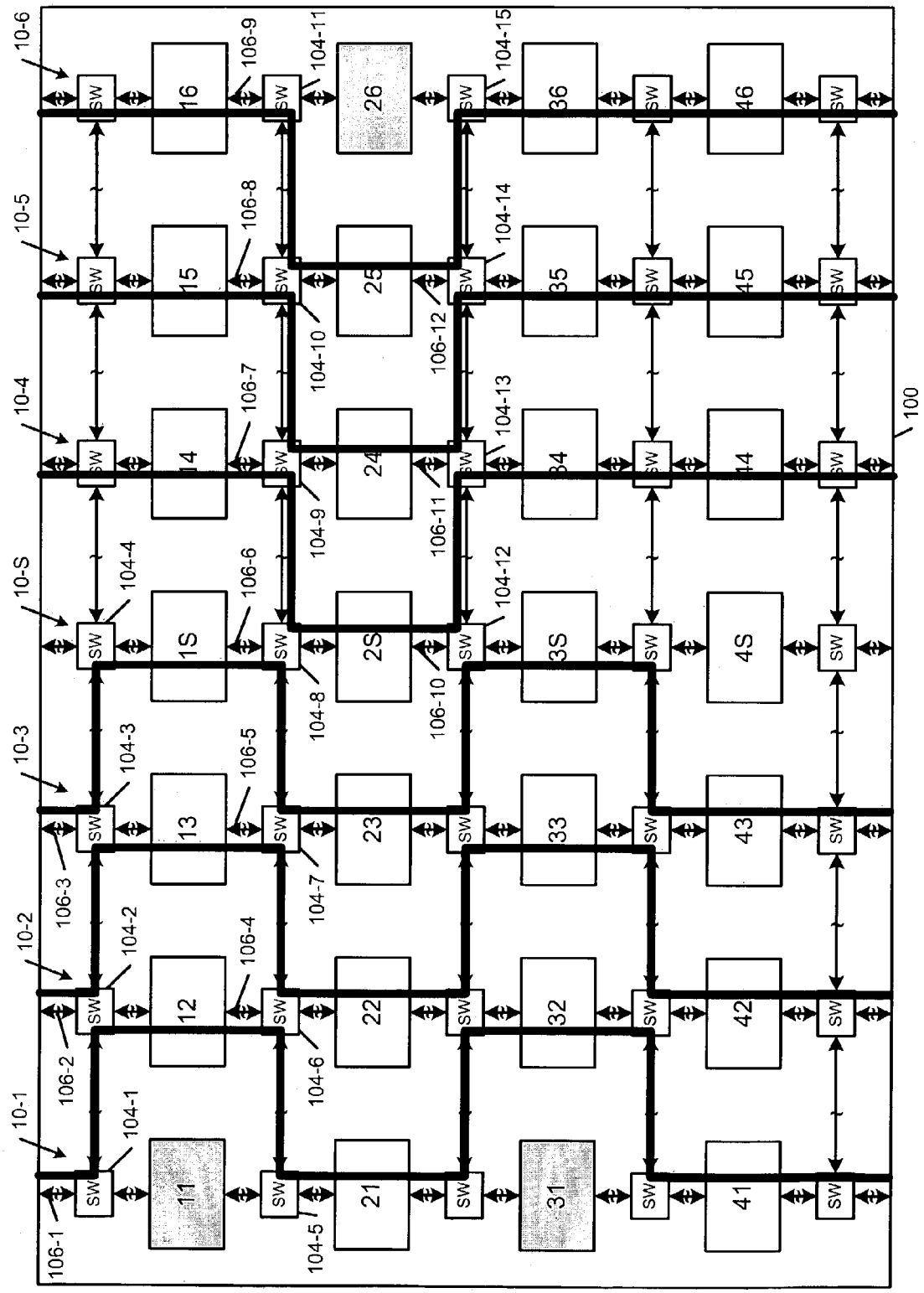
FIG. 5 is a functional block diagram of a second exemplary self-reparable semiconductor with a spare functional unit that replaces one or more non-operable sub-functional units according to the present invention.

Referring now to FIG. 5, a spare functional unit 10-S is fabricated on a semiconductor 100 in addition to the functional units 10-1, 10-2, . . . , and 10-6. In addition, switching devices 104 are located at inputs and outputs of the sub-functional units. In the exemplary embodiment illustrated in FIG. 5, the spare functional unit 10-S is located between the functional units 10.

The switching devices 104 and the spare functional unit 10-S allow the semiconductor 100 to replace non-operable sub-functional units in the functional units 10-1, 10-2, 10-3, 10-4, 10-5 and/or 10-6. In the example in FIG. 5, the spare functional unit 10-S allows one sub-functional unit in each row to fail. By allowing the replacement of non-operable sub-functional units, the yield of the semiconductor 100 is significantly improved. This exemplary embodiment allows replacement on a functional unit or a sub-functional unit basis and/or replacement of multiple sub-functional units in different functional units.

If the sub-functional units 11, 31 and 26 fail (as shown in shading), the switches 104 are reconfigured to replace the non-operable sub-functional units 11, 31 and 26 with sub-functional units 15, 35 and 25, respectively, in the spare functional unit 10-S.

The non-operable sub-functional unit 11 is replaced as follows: The inputs 106-1, 106-2, and 106-3 to the sub-functional units 11, 12, and 13 are shifted one functional unit to the right by switches 104-1, 104-2, 104-3, and 104-4. The outputs 106-4, 106-5, and 106-6 of the sub-functional units 12, 13, and 1S are shifted one functional unit to the left by switches 104-5, 104-6, 104-7, and 104-8. The non-operable sub-functional unit 13 is replaced in a similar manner.

The non-operable sub-functional unit 26 is replaced as follows: The outputs 106-7, 106-8, and 106-9 of the sub-functional units 14, 15, and 16 are shifted one functional unit to the left by switches 104-8, 104-9, 104-10, and 104-11. The outputs 106-10, 106-11, and 106-12 of the sub-functional units 2S, 24, and 25 are shifted one functional unit to the right by switches 104-12, 104-13, 104-14, and 104-15.

After reconfiguration, the first functional unit 10-1 includes sub-functional units 12, 21, 32, and 41. The second functional unit 10-2 includes sub-functional units 13, 22, 33, and 42. The third functional unit 10-3 includes sub-functional units 1S, 23, 3S, and 43. The fourth functional unit 10-4 includes sub-functional units 14, 2S, 34, and 44. The fifth functional unit 10-5 includes sub-functional units 15, 24, 35, and 45. The sixth functional unit 10-6 includes sub-functional units 16, 25, 36, and 46.

Figure 6:
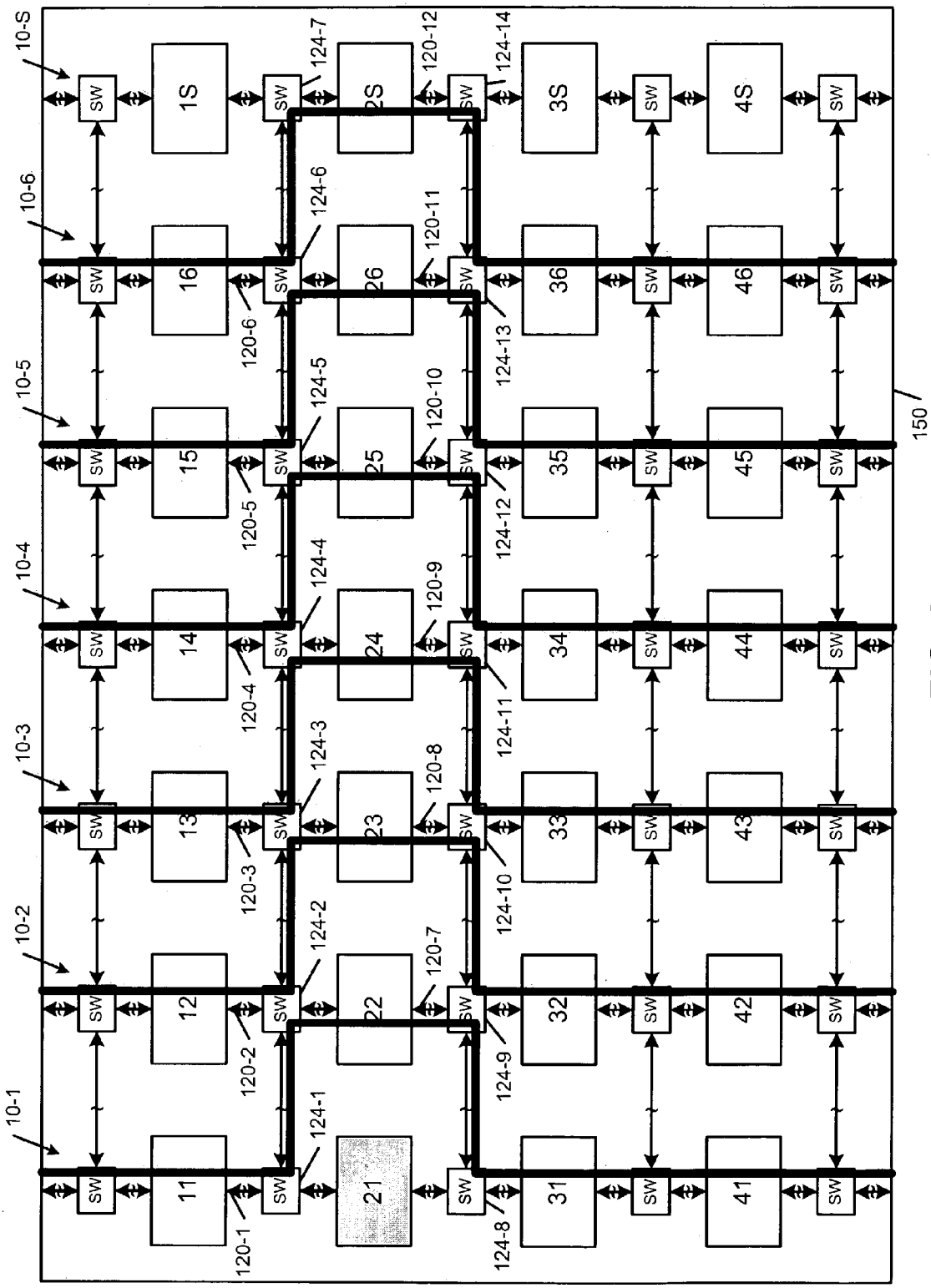
FIG. 6 is a functional block diagram of a third exemplary self-reparable semiconductor including a spare functional unit located at one end according to the present invention.

Referring now to FIG. 6, a semiconductor 150 includes the spare sub-functional unit 10-S that is located at one end. If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-7. The outputs 120-7, 120-8, . . . , and 120-12 of the sub-functional units 22, 23, . . . and 2S are shifted one functional unit to the left by switches 124-8, 124-9, . . . , and 124-14.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 7:
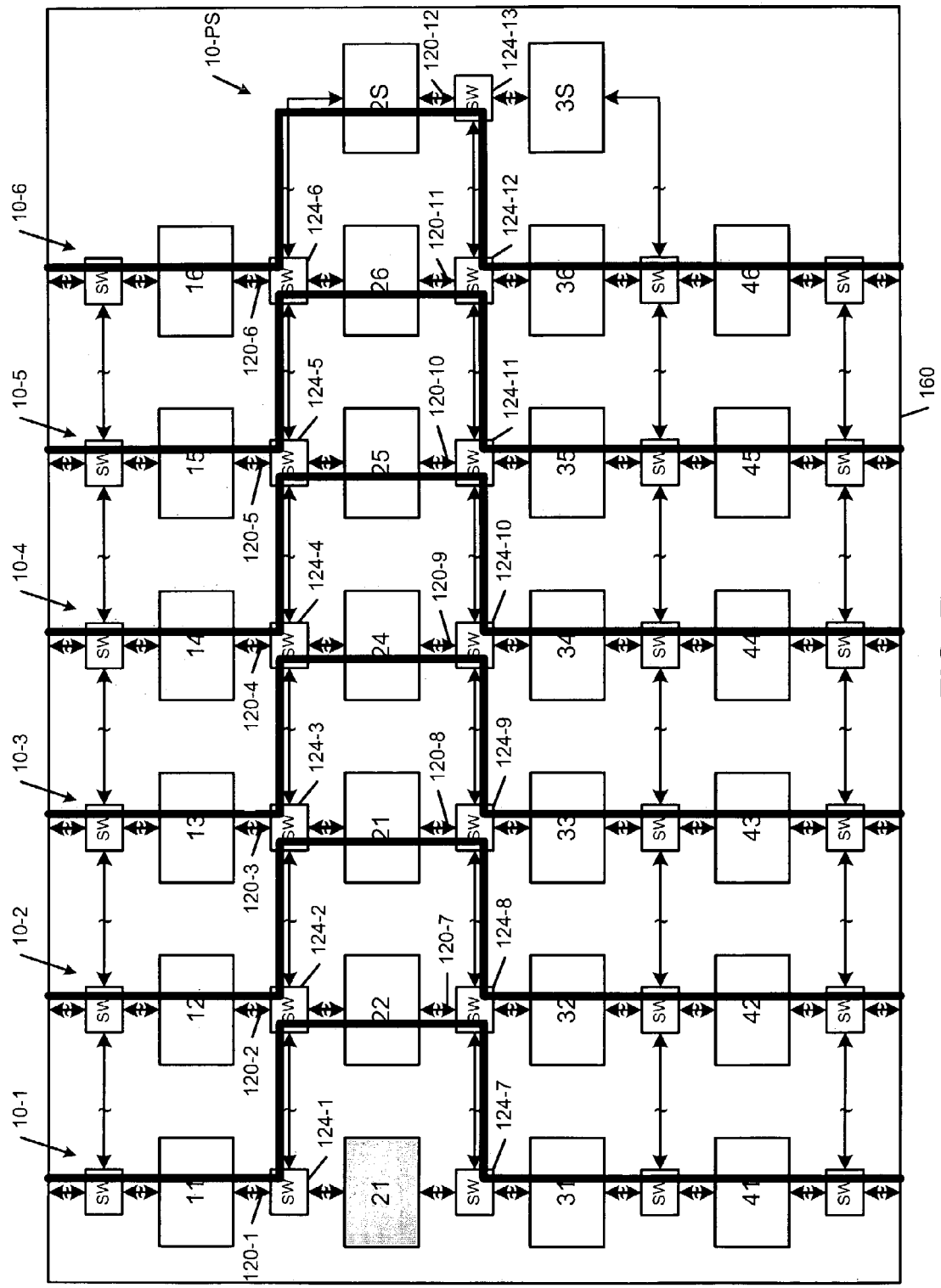
FIG. 7 is a functional block diagram of a fourth exemplary self-reparable semiconductor including a partial spare functional unit according to the present invention.

Referring now to FIG. 7, a semiconductor 160 includes a partial spare sub-functional unit 10-PS that is located at one end. The partial spare sub-functional unit 10-PS includes one or more sub-functional units (for some but not all of the sub-functional units). For example, the partial sub-functional unit 10-PS includes sub-functional units 2S and 3S but not 1S or 4S. The partial sub-functional units that are provided may be associated with sub-functional units that are more likely to have a lower yield. By not fabricating the other sub-functional units and switches, the cost of the semiconductor 160 may be reduced.

If the sub-functional unit 21 fails (as shown in shading), the inputs 120-1, 120-2, . . . , and 120-6 to the sub-functional units 21, 22, . . . , and 26 are shifted one functional unit to the right by switches 124-1, 124-2, . . . , and 124-6. The outputs 120-7, 120-8, . . . , and 120-12 of the sub-functional units 22, 23, . . . and 2S are shifted one functional unit to the left by switches 124-8, 124-9, . . . , and 124-13.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 24, 33, and 43. The fourth functional unit 10-4 includes sub-functional units 14, 25, 34, and 44. The fifth functional unit 10-5 includes sub-functional units 15, 26, 35, and 45. The sixth functional unit 10-6 includes sub-functional units 16, 2S, 36, and 46.

Figure 8:
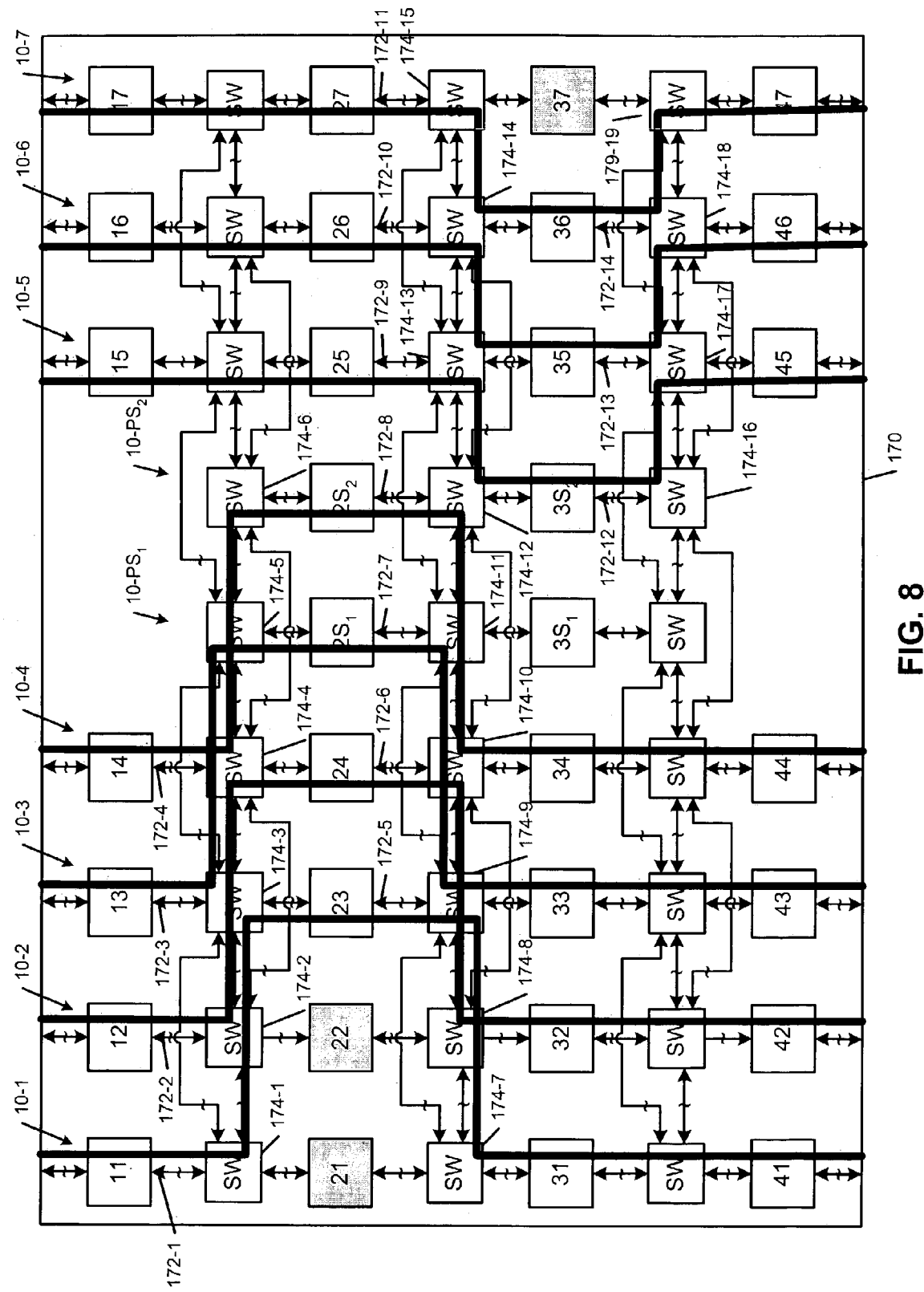
FIG. 8 is a functional block diagram of a fifth exemplary self-reparable semiconductor including two partial spare functional units located in the middle according to the present invention.

Referring now to FIG. 8, additional full and/or partial spare functional units can be provided. For example, a semiconductor 170 in FIG. 8 includes two partial spare sub-functional units 10-$PS_1$ and 10-$PS_2$. The full and/or partial spare sub-functional units 10-$PS_1$ and 10-$PS_2$ can be located adjacent to each other (as shown) or in non-adjacent positions. If the full or partial sub-functional units are located adjacent to each other, switches 172 switch inputs and/or outputs between two adjacent switches. For example, the switch 174-1 can switch inputs and/or outputs from sub-functional unit 11 to either sub-functional unit 22 or 23.

If the sub-functional units 21 and 22 fail (as shown in shading), the inputs 172-1, 172-2, 172-3, and 172-4 to the sub-functional units 21, 22, 23 and 24 are shifted two functional units to the right by switches 174-1, 174-2, . . . , and 174-6. The outputs 172-5, 172-6, . . . , and 172-8 of the sub-functional units 23, 24, 2S$_1$ and 2S$_2$ are shifted two functional units to the left by switches 174-7, 174-8, . . . , and 174-12.

If the sub-functional unit 37 fails, the inputs 172-9, 172-10, and 172-11 to the sub-functional units 35, 36, and 37 are shifted one functional unit to the left by switches 174-12, 174-13, 174-14, and 174-15. The outputs 172-12, 172-13, and 172-14 of the sub-functional units 3S$_2$, 35, and 36 are shifted one functional unit to the right by switches 174-16, 174-17, 174-18, and 174-19.

After reconfiguration, the first functional unit 10-1 includes sub-functional units 11, 23, 31, and 41. The second functional unit 10-2 includes sub-functional units 12, 24, 32, and 42. The third functional unit 10-3 includes sub-functional units 13, 2S$_1$, 33, and 43. The fourth functional unit 10-4 includes sub-functional units 14, 2S$_2$, 34, and 44. The fifth functional unit 10-5 includes sub-functional units 15, 25, 3S$_2$, and 45. The sixth functional unit 10-6 includes sub-functional units 16, 26, 35, and 46. The seventh functional unit 10-7 includes sub-functional units 17, 27, 36, and 47.

Figure 9:
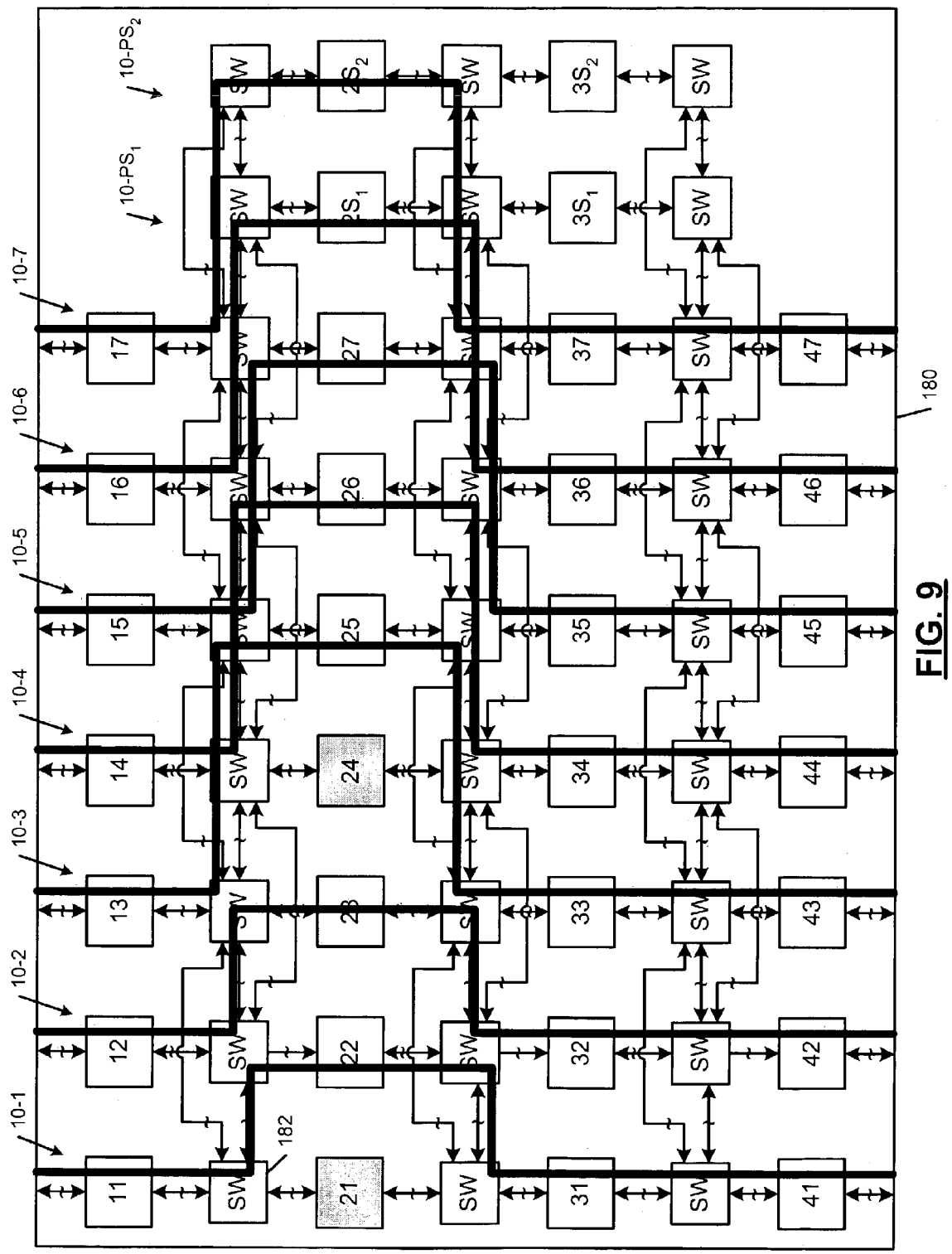
FIG. 9 is a functional block diagram of a sixth exemplary self-reparable semiconductor including two partial spare functional units located at one end according to the present invention.

The semiconductor can also include two or more full and/or partial functional units that are located at one end or in any other position. In FIG. 9, two partial spare functional units 10-PS$_1$ and 10-PS$_2$ are located at one end of a semiconductor 180. If sub-functional units 21 and 24 fail (as shown in shading), the switching devices 182 replace them with sub-functional units 2S$_1$ and 2S$_2$ in the spare functional units 10-PS$_1$ and 10PS$_2$.

After reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 25, 33, and 43. The fourth functional unit 10-4 includes sub-functional units 14, 26, 34, and 44. The fifth functional unit 10-5 includes sub-functional units 15, 27, 35, and 45. The sixth functional unit 10-6 includes sub-functional units 16, 2S$_1$, 36, and 46. The seventh functional unit 10-7 includes sub-functional units 17, 2S$_2$, 37, and 47.

Figure 10:
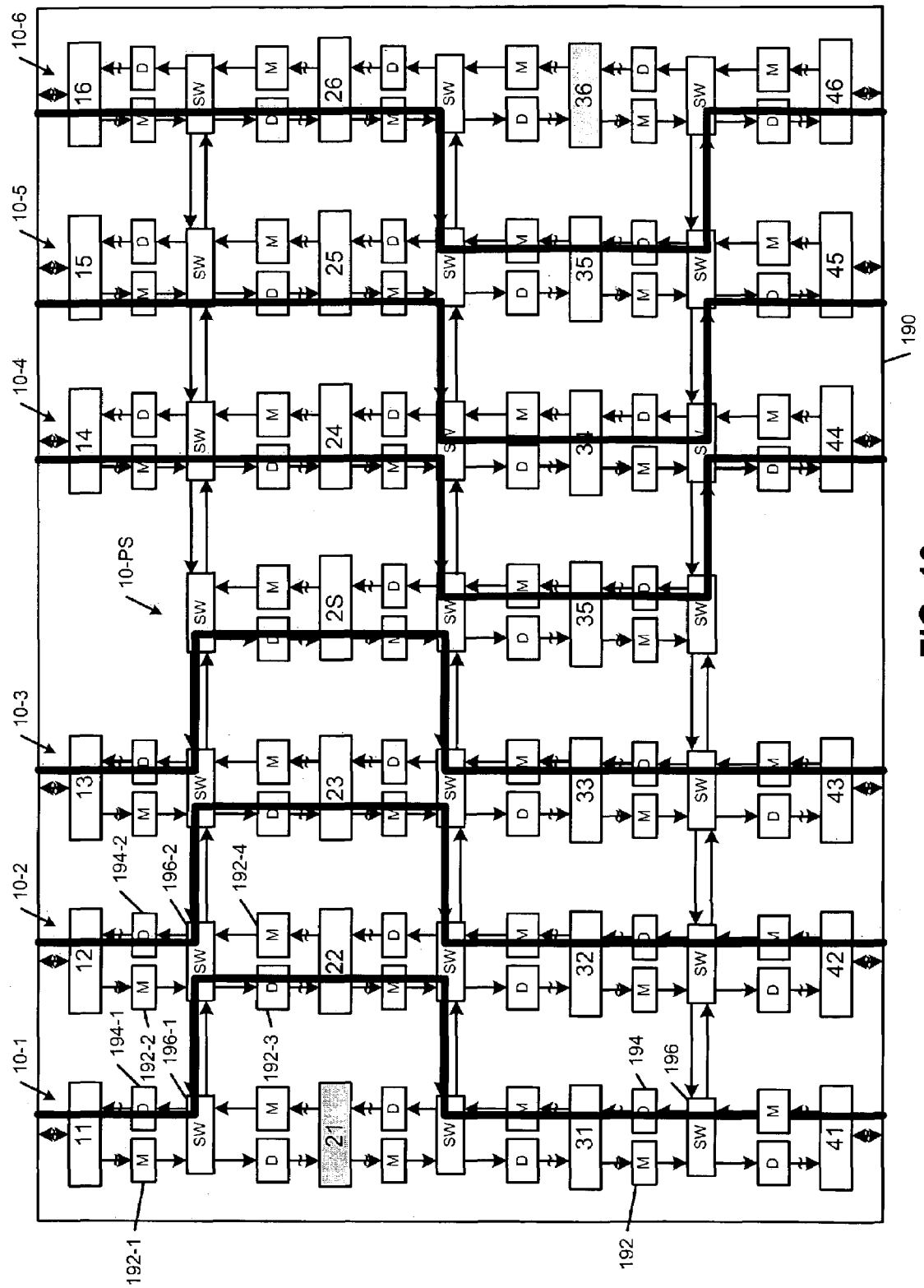
FIG. 10 is a functional block diagram of a seventh exemplary self-reparable semiconductor including a partial spare functional unit and multiplexed switching devices according to the present invention.

Referring now to FIG. 10, to reduce the complexity of the switching devices, the semiconductor 190 includes multiplexed switching devices that include multiplexers (M) 192 that receive p input signals and that output1 to q output signals, where q is less than p. For example, p input signals can be multiplexed into one output signal.

Alternately, the p input signals can be multiplexed into two or more output signals. For example, eight input signals can be multiplexed into three output signals. In this example, one input signal is not multiplexed, for example a high speed signal such as data signals in the Gigabit physical layer device. Two medium speed signals can be multiplexed into one output signal. The remaining five input signals, which are preferably "slow" signals such as control signals in the Gigabit PHY, can be multiplexed into one output signal.

Figure 11:
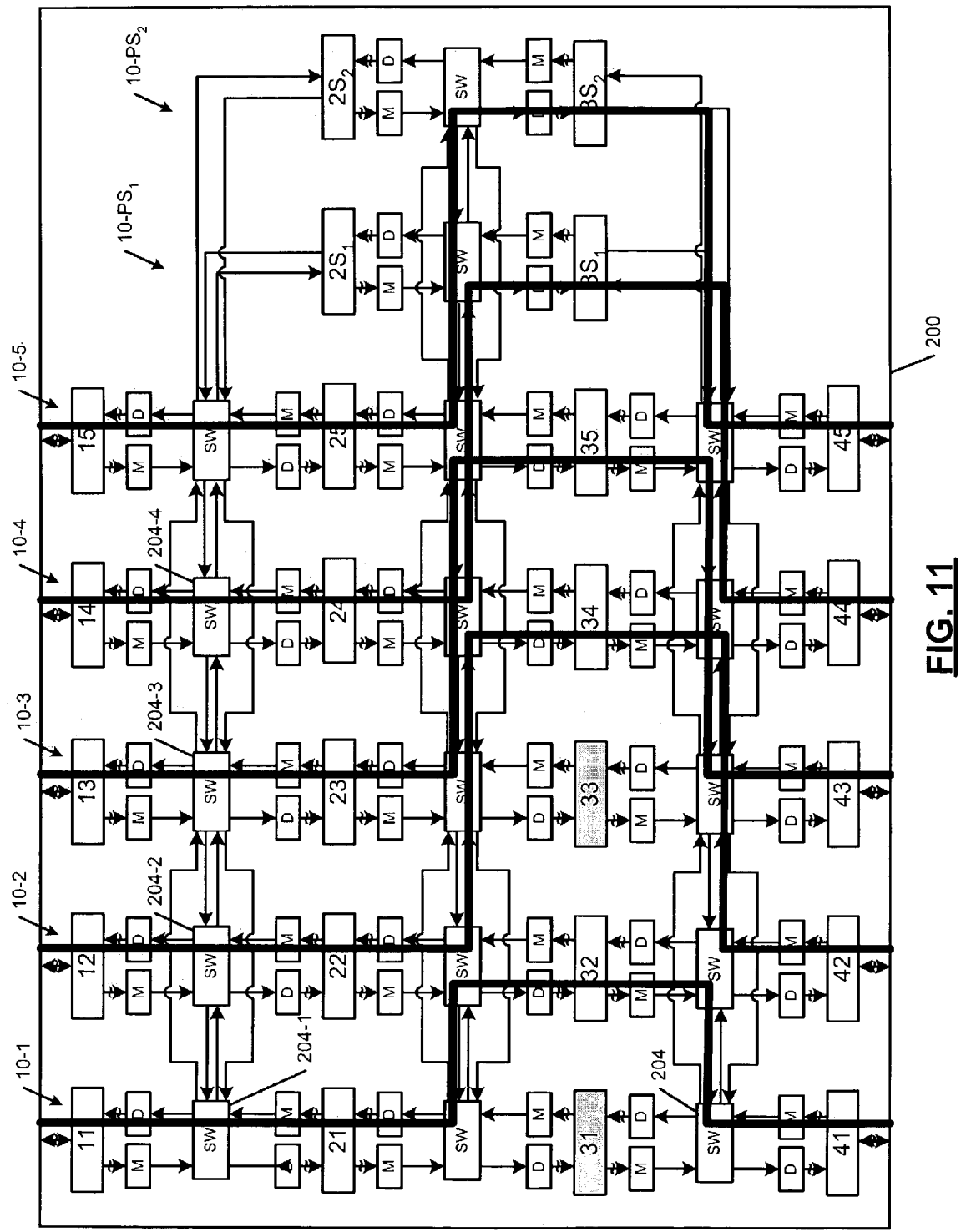
FIG. 11 is a functional block diagram of an eighth exemplary self-reparable semiconductor including multiple functional units each with sub-functional units, two partial spare functional units and multiplexed switching devices according to the present invention.

Demultiplexers (D) 194 receive 1 to q input signals and generate p output signals. The number of inputs and outputs that are multiplexed and demultiplexed will depend upon the particular sub-functional units that communicate with the multiplexers 192 and demultiplexers 194. By decreasing the number of connecting wires that need to be switched, the switching devices can be simplified. The exemplary embodiments shown in FIGS. 10 and 11 show multiple inputs that are multiplexed to a single output. Based on the preceding discussion, however, skilled artisans will appreciate that the output of the multiplexer may include one or more outputs that may be multiplexed or not multiplexed.

For example, if the sub-functional unit 21 fails, the switching devices 196-1 and 196-2 connect the multiplexer 192-1 with the demultiplexer 192-3. This establishes a forward path for signals being sent from the sub-functional unit 11 to the sub-functional unit 22 (which replaces non-operable sub-functional unit 21). The demultiplexer 192-3 communicates with the sub-functional unit 22. Likewise, a reverse path can be established if needed. The switching devices 196-1 and 196-2 connect the multiplexer 192-4 to the demultiplexer 194-1, which communicates with the sub-functional unit 11. As can be appreciated, while forward and reverse signal paths are shown, forward and/or reverse paths may be used between the sub-functional units as needed. Some of the multiplexers and demultiplexers can be omitted if both forward and reverse paths are not used between sub-functional units.

After failure and reconfiguration, the first functional unit 10-1 includes sub-functional units 11, 22, 31, and 41. The second functional unit 10-2 includes sub-functional units 12, 23, 32, and 42. The third functional unit 10-3 includes sub-functional units 13, 2S, 33, and 43. The fourth functional unit 10-4 includes sub-functional units 14, 24, 3S, and 44. The fifth functional unit 10-5 includes sub-functional units 15, 25, 34, and 45. The sixth functional unit 10-6 includes sub-functional units 16, 26, 35, and 46.

The semiconductor with multiplexed switching devices can include multiple full or partial spare sub-functional units. Referring now to FIG. 11, a semiconductor 200 includes two partial spare sub-functional units 10-PS, and 10PS$_2$. The multiple full or partial spare sub-functional units need not be located adjacent to each other. Switching devices 204 connect to at least two adjacent switches. For example, the switching device 204-1 communicates with the switching devices 204-2 and 204-3. Likewise, the switching device 204-2 communicates with the switching devices 204-3 and 204-4. The semiconductor 200 is capable of replacing two failures in the same row.

For example, if sub-functional units 31 and 33 fail (as shown in shading), the switches 204 are reconfigured. The first functional unit 10-1 includes sub-functional units 11, 21, 32, and 41. The second functional unit 10-2 includes sub-functional units 12, 22, 34, and 42. The third functional unit 10-3 includes sub-functional units 13, 23, 35, and 43. The fourth functional unit 10-4 includes sub-functional units 14, 24, 3S$_1$, and 44. The fifth functional unit 10-5 includes sub-functional units 15, 25, 3S$_2$, and 45.

Assuming that defects are uniformly and independently distributed on the semiconductor (which may or may not be true), if the yield for a single functional unit is $P_S$, then the yield for a first sub-functional unit is $P_{sub1}=P_S((area of sub-functional unit)/area of functional unit))$. The yield $P_S$ of the functional unit is equal to the product of the yields for each sub-functional unit.

If p is the yield of the functional units, m is the minimum number of working functional units and n is equal to m plus the number of spare functional units, the yield is defined as follows:

$$\text{yield} = f(p, m, n) = \sum_{x=m}^{n} p^x (1-p)^{n-x} \frac{n!}{x!(n-x)!}$$

For example, a semiconductor with 8 functional units each having a uniform yield of 90% (and spare functional units) would have a yield of 43%. Assume that the functional units have four sub-functional blocks A, B, C, and D. All of the sub-functional blocks are swapped out as a group if A, B, C and/or D experience a fault. With one spare functional unit, the yield increases to 77.5%.

If the functional blocks can be swapped out in two groups (A and B) and/or (C and D), the yield is equal to:

$$\text{yield} = f(p_A \times p_B, m, n) \times f(p_C \times p_D, m, n)$$

In this example, the yield increases to 85.6%.

If the functional blocks can be swapped out in three groups (A and B), C and/or D, the yield is equal to:

$$\text{yield} = f(p_A \times p_B, m, n) \times f(p_C, m, n) \times f(p_D, m, n)$$

In this example, the yield increases to 88.6%.

If the functional blocks can be swapped out in four groups A, B, C and/or D, the yield is equal to:

$$\text{yield} = f(p_A, m, n) \times f(p_B, m, n) \times f(p_C, m, n) \times f(p_D, m, n)$$

In this example, the yield increases to 91.7%.

As can be appreciated, providing one spare functional unit increase yield dramatically. Splitting the functional units into two or more sub-functional units that can be individually swapped out further increases yield. At some point, the tradeoff between improved yield is offset by increased design complexity.

Figure 12:
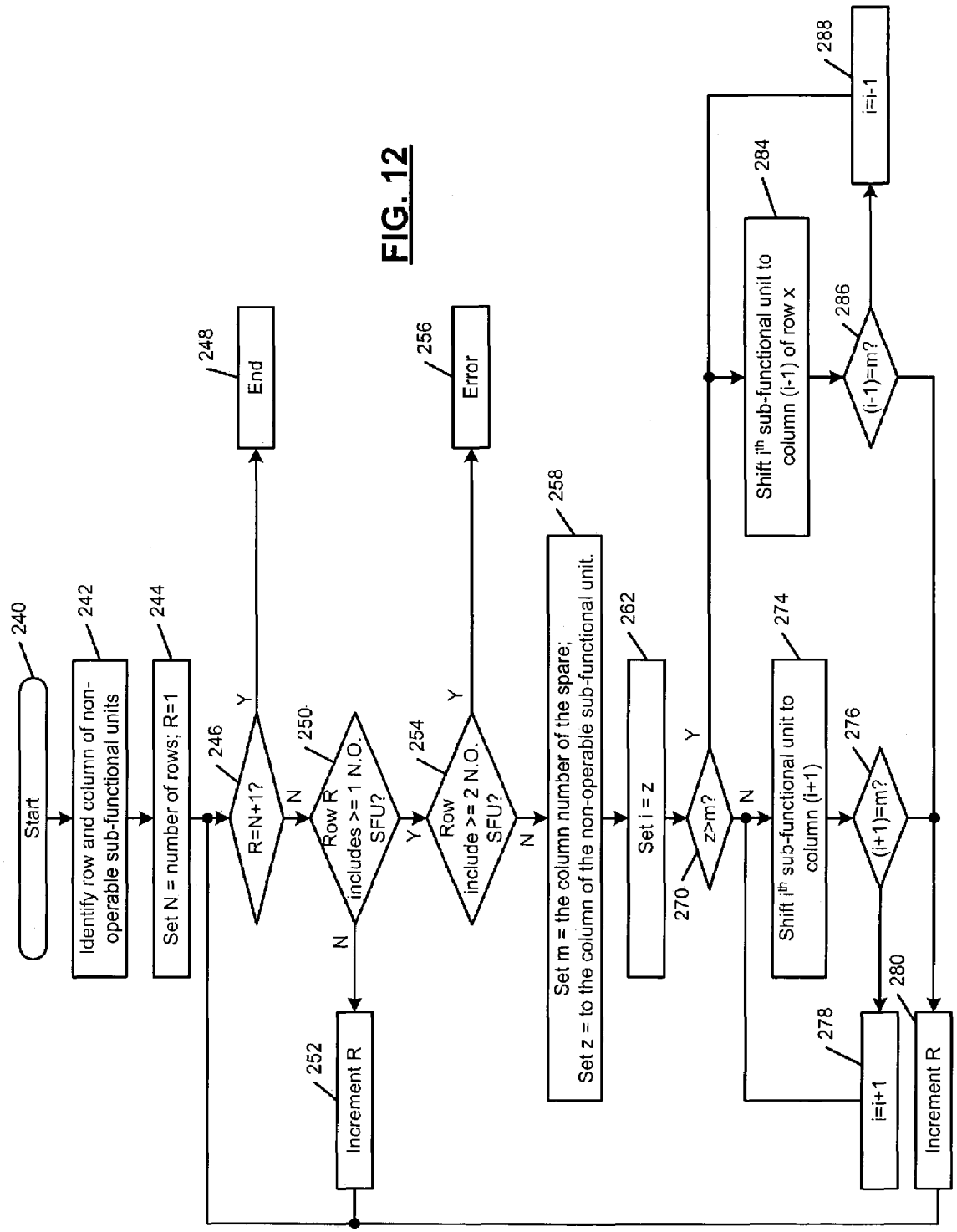
FIG. 12 is a flowchart illustrating steps for replacing non-operable sub-functional units with sub-functional units in a single spare functional unit.

Referring now to FIG. 12, steps of a method for replacing non-operable sub-functional units using a single full or partial functional unit is shown. Control begins with step 240. In step 242, control identifies rows and columns of non-operable sub-functional units. In step 244, control sets N equal to the number of rows in the functional units and sets R equal to one. In step 246, control determines whether R is equal to N+1. If true, control ends in step 248. If false, control continues with step 250 where control determines if row R has greater than or equal to one non-operable (N.O.) sub-functional unit (SFU). If false, control increments R in step 252 and control returns to step 246. If true, control continues with step 254 where control determines if row R includes greater than or equal to two non-operable (N.O.) sub-functional units (SFU). Since only one spare full or partial sub-functional unit is provided, an error is signaled in step 256 if two or more non-operable sub-functional units are in the same row.

In step 258, control sets m equal to the column number of the full or partial spare functional unit and z equal to the column of the non-operable sub-functional unit. In step 262, control sets i=z. In step 270, control determines whether z>m. If false, control continues with step 274 and shifts the $i^{th}$ sub-functional unit to column (i+1) using the switching devices. In step 276, control determines whether (i+1)=m. If not, control increments i in step 278 and continues with step 274. Otherwise, control increments R in step 280 and control continues with step 254.

If z is greater than m in step 270, control continues with step 284 and shifts the $i^{th}$ sub-functional unit to column (i−1) using the switching devices. In step 286, control determines whether (i−1) is equal to m. If not, control decrements i in step 288 and continues with step 284. Otherwise, control continues with step 280.

As can be appreciated by skilled artisans, similar algorithms for replacing non-operable functional units and/or sub-functional units can be performed for semiconductors including two or more full or partial spare functional units and/or sub-functional units. In addition, while specific switching arrangements are shown, the specific switching devices that will be used will depend upon the particular implementation, details of the particular functional and/or sub-functional units and other normal design criteria. Various different types of switching devices may also be used on the same semiconductor.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A self-reparable semiconductor, comprising:
   M functional units each including N sub-functional units, wherein each of said M functional units perform the same function, wherein M and N are greater than 1, and wherein each corresponding ones of the N sub-functional units perform the same function;
   a first spare functional unit including X sub-functional units, wherein X is greater than or equal to one and less than or equal to N and wherein said X sub-functional units of said first spare functional unit are functionally interchangeable with corresponding sub-functional units of said M functional units; and
   a plurality of switching devices that replace at least one of said N sub-functional units with at least one of said X sub-functional units when said at least one of said N sub-functional units is non-operable, wherein m is equal to a column number of said first spare functional unit and z is equal to a column number of said first non-operable sub-functional unit, wherein when z is greater than m, said switching devices shift z−m sub-functional units adjacent to said first non-operable sub-functional unit over one sub-functional unit in one direction towards said column m, and wherein when z is less than m, said switching devices shift m−z sub-functional units adjacent to said first non-operable sub-functional unit over one sub-functional unit in an opposite direction towards said column m.

2. The self-reparable semiconductor of claim 1 further comprising a second spare functional unit including said X sub-functional units.

3. The self-reparable semiconductor of claim 2 wherein said first non-operable sub-functional unit occurs in the same row as a second non-operable sub-functional unit, wherein y is equal to a column number of said second nonoperable sub-functional unit, wherein when z and y are greater than m, said switching devices shift at least one sub-functional unit over two sub-functional units in said one direction towards said column m, and wherein when z and y are less than m, said switching devices shift at least one sub-functional unit over two sub-functional units in said opposite direction towards said column m.

4. The self-reparable semiconductor of claim 3 wherein when one of z and y is less than m and the other of z and y is greater than m, said switching devices shift at least one sub-functional unit in said one direction and at least one sub-functional unit in said opposite direction.

5. The self-reparable semiconductor of claim 2 further comprising a controller that identifies at least one non-operable sub-functional unit and that generates configuration data for configuring said switching devices to replace said at least one non-operable sub-functional unit.

6. The self-reparable semiconductor of claim 5 wherein said controller is located on said self-reparable semiconductor.

7. The self-reparable semiconductor of claim 5 wherein said controller is located off said self-reparable semiconductor and further comprising memory located on said self-reparable semiconductor for storing said configuration data for said switching devices.

8. The self-reparable semiconductor of claim 1 wherein said switching devices include at least one of analog and digital switching devices.

9. The self-reparable semiconductor of claim 8 wherein said analog switching devices comprises at least one of a current based switching device and a summing node switching device.

10. A self-reparable semiconductor including a plurality of physical layer devices defining independent ports, comprising:
M physical layer devices defining M independent and functionally interchangeable ports;
a first spare physical layer device that is functionally interchangeable with said M physical layer devices; and
switching devices that communicate with said M physical layer devices and said spare physical layer device and that replace at least one of said M physical layer devices with said spare physical layer device when said at least one of said M physical layer devices is non-operable, wherein m is equal to a column number of said first spare physical layer device and z is equal to a column number of said first non-operable physical layer device,
wherein when z is greater than m, said switching devices shift z−m physical layer devices adjacent to said first non-operable physical layer device over one physical layer device in one direction towards said column m, and
wherein when z is less than m, said switching devices shift m−z physical layer devices adjacent to said first non-operable physical layer device over one physical layer device in an opposite direction towards said column m.

11. The self-reparable semiconductor of claim 10 further comprising a controller located on said self-reparable semiconductor that identifies at least one non-operable sub-functional unit and that generates configuration data for configuring said switching devices to replace said at least one non-operable subfunctional unit.

12. The self-reparable semiconductor of claim 10 further comprising:
a controller located off said self-reparable semiconductor that identifies at least one non-operable sub-functional unit and that generates configuration data for configuring said switching devices to replace said at least one non-operable sub-functional unit; and
memory located on said self-reparable semiconductor for storing said configuration data for said switching devices.

13. The self-reparable semiconductor of claim 10 wherein said M physical layer devices are Gigabit physical layer devices.

14. The self-reparable semiconductor of claim 10 wherein M is equal to one of four and eight.

15. The self-reparable semiconductor of claim 10 wherein said switching devices include at least one of analog and digital switching devices.

16. The self-reparable semiconductor of claim 15 wherein said analog switching devices comprises at least one of a current based switching device and a summing node switching device.

17. A self-reparable semiconductor, comprising:
M functional means for performing the same function and each including N sub-functional means for performing sub-functions, wherein M and N are greater than 1, and wherein each corresponding ones of the N sub-functional means perform the same function;
a first spare functional means for replacing non-operable subfunctional units and including X sub-functional means for performing subfunctions, wherein X is greater than or equal to one and less than or equal to N and wherein said X sub-functional means of said first spare functional means are functionally interchangeable with corresponding sub-functional means of said M functional means; and
switching means for replacing at least one of said N sub-functional means with at least one of said X sub-functional means when said at least one of said N sub-functional means is non-operable, wherein m is equal to a column number of said first spare functional means and z is equal to a column number of said first non-operable sub-functional means, wherein when z is greater than m, said switching means shifts z−m sub-functional means adjacent to said first non-operable sub-functional means over one sub-functional means in one direction towards said column m, and wherein when z is less than m, said switching means shifts m−z sub-functional means adjacent to said first non-operable sub-functional means over one sub-functional means in an opposite direction towards said column m.

18. The self-reparable semiconductor of claim 17 further comprising a second spare functional means for replacing non-operable sub-functional units including said X sub-functional means for performing sub-functions.

19. The self-reparable semiconductor of claim 18 wherein said first non-operable sub-functional means occurs in the same row as a second nonoperable sub-functional means, wherein y is equal to a column number of said second nonoperable sub-functional means, wherein when z and y are greater than m, said switching means shifts at least one sub-functional means over two sub-functional means in said one direction towards said column m, and wherein when z and y are less than m, said switching means shifts at least one sub-functional means over two sub-functional means in said opposite direction towards said column m.

20. The self-reparable semiconductor of claim 19 wherein when one of z and y is less than m and the other of z and y is greater than m, said switching means shifts at least one sub-functional means in said one direction and at least one sub-functional means in said opposite direction.

21. The self-reparable semiconductor of claim 18 further comprising control means that identifies at least one non-operable sub-functional means and that generates configuration data for configuring said switching means to replace said at least one non-operable sub-functional means.

22. The self-reparable semiconductor of claim 21 wherein said control means is located on said self-reparable semiconductor.

23. The self-reparable semiconductor of claim 21 wherein said control means is located off said self-reparable semiconductor and further comprising storage means located on said self-reparable semiconductor for storing said configuration data.

24. The self-reparable semiconductor of claim 17 wherein said switching means includes at least one of analog and digital switching devices.

25. The self-reparable semiconductor of claim 24 wherein said analog switching devices comprises at least one of a current based switching device and a summing node switching device.

26. A self-reparable semiconductor including a plurality of physical layer devices defining independent ports, comprising:

M physical layer devices defining M independent ports;

a first spare physical layer device that is functionally interchangeable with said M physical layer devices; and switching means that communicates with said M physical layer devices and said spare physical layer device for replacing at least one of said M physical layer devices with said spare physical layer device when said at least one of said M physical layer devices is non-operable, wherein m is equal to a column number of said first spare physical layer device and z is equal to a column number of said first non-operable physical layer device, wherein when z is greater than m, said switching means shifts z−m physical layer devices adjacent to said first non-operable physical layer device over one physical layer device in one direction towards said column m, and wherein when z is less than m, said switching means shifts m−z physical layer devices adjacent to said first non-operable physical layer device over one physical layer device in an opposite direction towards said column m.

27. The self-reparable semiconductor of claim 26 further comprising control means located on said self-reparable semiconductor for identifying at least one non-operable sub-functional means and for generating configuration data for configuring said switching means to replace said at least one nonoperable sub-functional means.

28. The self-reparable semiconductor of claim 26 further comprising: control means located off said self-reparable semiconductor for identifying at least one non-operable sub-functional means and for generating configuration data that configures said switching means to replace said at least one non-operable sub-functional means; and storage means located on said self-reparable semiconductor for storing said configuration data.

29. The self-reparable semiconductor of claim 26 wherein said M physical layer devices are Gigabit physical layer devices.

30. The self-reparable semiconductor of claim 26 wherein M is equal to one of four and eight.

31. The self-reparable semiconductor of claim 26 wherein said switching means includes at least one of analog and digital switching devices.

32. The self-reparable semiconductor of claim 31 wherein said analog switching devices comprises at least one of a current based switching device and a summing node switching device.

33. A method of operating a self-reparable semiconductor, comprising: providing M functional units each including N sub-functional units, wherein each of said M functional units perform the same function, wherein M and N are greater than 1, and wherein each corresponding ones of the N subfunctional units perform the same function;

providing a first spare functional unit including X sub-functional units, wherein X is greater than or equal to one and less than or equal to N and wherein said X sub-functional units of said first spare functional unit are functionally interchangeable with corresponding sub-functional units of said M functional units;

replacing at least one of said N sub-functional units with at least one of said X sub-functional units when said at least one of said N sub-functional units is non-operable, wherein m is equal to a column number of said first spare functional unit and z is equal to a column number of said first non-operable subfunctional unit;

shifting z−m sub-functional units that are adjacent to said first non-operable sub-functional unit over one sub-functional unit in one direction towards said column m when z is greater than m; and shifting m−z sub-functional units adjacent to said first non-operable sub-functional unit over one sub-functional unit in an opposite direction towards said column m when z is less than m.

34. The method of claim 33 further comprising providing a second spare functional unit including said X sub-functional units.

35. The method of claim 34 wherein said first non-operable sub-functional unit occurs in the same row as a second non-operable sub-functional unit, wherein y is equal to a column number of said second non-operable subfunctional unit, and further comprising:

shifting at least one sub-functional unit over two sub-functional units in said one direction towards said column m when z and y are greater than m; and shifting at least one sub-functional unit over two sub-functional units in said opposite direction towards said column m when z and y are less than m.

36. The method of claim 35 further comprising shifting at least one sub-functional unit in said one direction and at least one sub-functional unit in said opposite direction when one of z and y is less than m and the other of z and y is greater than m.

37. The method of claim 33 further comprising:

identifying at least one non-operable sub-functional unit; and generating configuration data to replace said at least one nonoperable sub-functional unit.

38. The method of claim 37 further comprising locating said controller on said self-reparable semiconductor.

39. The method of claim 37 further comprising:

locating said controller off said self-reparable semiconductor; and storing said configuration data in memory located on said selfreparable semiconductor.

40. The method of claim 33 further comprising using at least one of analog and digital switching devices to replace non-operable sub-functional units.

41. The method of claim 33 wherein said replacing step comprises at least one of:

current switching analog signals; and summing node switching the analog signals.

42. A method of operating a self-reparable semiconductor including a plurality of physical layer devices defining independent ports, comprising:

providing M physical layer devices defining M independent and functionally interchangeable ports;

providing a first spare physical layer device that is functionally interchangeable with said M physical layer devices; and replacing at least one of said M physical layer devices with said first spare physical layer device when said at least one of said M physical layer devices is non-operable, wherein m is equal to a column number of said first spare physical layer device and z is equal to a column number of said first non-operable physical layer device, and further comprising:

shifting z−m physical layer devices adjacent to said first nonoperable physical layer device over one physical layer device in one direction towards said column m when z is greater than m; and shifting m−z physical layer devices adjacent to said first nonoperable physical layer device over one physical layer device in an opposite direction towards said column m when z is less than m.

43. The method of claim 42 further comprising locating a controller on said self-reparable semiconductor that identifies at least one non-operable subfunctional unit and that generates configuration data to replace said at least one non-operable sub-functional unit.

44. The method of claim 42 further comprising:

locating a controller off said self-reparable semiconductor that identifies at least one non-operable sub-functional unit and that generates configuration data to replace said at least one non-operable sub-functional unit; and storing said configuration data in memory located on said selfreparable semiconductor.

45. The method of claim 42 wherein said M physical layer devices are Gigabit physical layer devices.

46. The method of claim 42 wherein M is equal to one of four and eight.

47. The method of claim 42 further comprising using at least one of analog and digital switching devices to replace non-operable sub-functional units.

48. The method of claim 42 wherein said replacing step comprises at least one of:

current switching analog signals; and summing node switching the analog signals.

* * * * *

UNITED STATES PATENT AND TRADEMARK OFFICE
CERTIFICATE OF CORRECTION

| | |
|---|---|
| PATENT NO. | : 7,185,225 B2 |
| APPLICATION NO. | : 10/358709 |
| DATED | : February 27, 2007 |
| INVENTOR(S) | : Sehat Sutardja et al. |

It is certified that error appears in the above-identified patent and that said Letters Patent is hereby corrected as shown below:

Column 8, Line 27:   Delete "10-PS," and insert --10-PS,--

Signed and Sealed this

Twenty-second Day of May, 2007

JON W. DUDAS
*Director of the United States Patent and Trademark Office*